United States Patent [19]

Hamilton et al.

[11] Patent Number: 5,656,521
[45] Date of Patent: Aug. 12, 1997

[54] METHOD OF ERASING UPROM TRANSISTORS

[75] Inventors: Darlene Hamilton, Gilroy; Issac H. Yamasaki, Sunnyvale, both of Calif.

[73] Assignee: Advanced Micro Devices, Inc., Sunnyvale, Calif.

[21] Appl. No.: 371,704

[22] Filed: Jan. 12, 1995

[51] Int. Cl.$^6$ .................. H01L 21/263; H01L 21/8246
[52] U.S. Cl. .................. 438/4; 365/185.32; 365/218; 257/323; 438/15; 438/257; 438/308; 438/972
[58] Field of Search ................ 437/43, 48, 52, 437/173, 45; 257/323; 250/573; 365/185.29, 185.31, 185.32, 218

[56] References Cited

U.S. PATENT DOCUMENTS

| | | | |
|---|---|---|---|
| 3,812,479 | 5/1974 | Wittles et al. | |
| 4,393,479 | 7/1983 | Du et al. | 365/218 |
| 5,063,424 | 11/1991 | Melanotte et al. | |
| 5,343,434 | 8/1994 | Noguchi | 365/218 |
| 5,379,249 | 1/1995 | Salmon | 365/104 |
| 5,440,510 | 8/1995 | Caprara et al. | 257/323 |

FOREIGN PATENT DOCUMENTS

| | | |
|---|---|---|
| 212520 | 3/1987 | European Pat. Off. |
| 59-75496 | 4/1984 | Japan . |
| 59-89469 | 5/1984 | Japan . |
| 59-90961 | 5/1984 | Japan . |
| 60-113463 | 6/1985 | Japan . |
| 60-119772 | 6/1985 | Japan . |
| 61-107599 | 5/1986 | Japan . |
| 63-153856 | 6/1988 | Japan . |
| 2-81399 | 3/1990 | Japan . |
| 5-128892 | 5/1993 | Japan . |

OTHER PUBLICATIONS

R.R. Ferber, IEEE Trans. Nucl. Sci., 18 (1971)138 "Preprogrammed . . . memory by use of ionizing radiation". Jun. 1971.

D.R. Myers, IEEE Trans. Nucl. Sci., NS28 (6) (1981)4038, "UV EPROM erasure in flash X-ray . . . ". Dec. 1981.

W.E. Abare et al., IEEE Trans. Nucl. Sci., NS30 (6) (1983) 4285 "Flash X-ray testing of . . . EAROMS". Dec. 1983.

*Primary Examiner*—Charles L. Bowers, Jr.
*Assistant Examiner*—Leon Radomsky

[57] ABSTRACT

The failure rate of semiconductor devices containing UPROM transistors is improved by erasing the UPROM transistors using X-rays. The semiconductor devices are subsequently exposed to UV radiation to erase other transistors charged during X-ray exposure.

32 Claims, 2 Drawing Sheets

METHOD OF ERASING UPROM TRANSISTORS

TECHNICAL FIELD

The present invention relates to manufacturing semiconductor devices comprising UPROM transistors, particularly adjusting the threshold voltage of UPROM transistors to increase yields.

BACKGROUND ART

Conventional EPROM (Electrically Programmable Read Only Memory) transistors comprise layers for storing charges, i.e., electrons, which are usually called floating gates or stacked gates. EPROM transistors are programmable by adding electrons to the floating gate, thereby adjusting the threshold voltage (Vt), as from about 1.0 volt to greater than about 3 or above 4 volts. When the Vt is about 1, the EPROM transistor is considered unprogrammed (logic 0) or "blank." Thus, a blank EPROM transistor conducts current in normal circuit read out operations, while a programmed EPROM transistor (logic 1) does not conduct current. The existence of two logic states (1 and 0) in EPROM transistors enable binary data to be stored. EPROM transistors can normally be returned to an all blank (unprogrammed) state by exposure to ultraviolet (UV) radiation of a certain wavelength and intensity, thereby effecting erasure. Conventional manufacturing techniques involve the production of wafers containing a plurality of EPROM circuits from which individual EPROM circuits are cut and packaged as by encapsulation. There are commercially available EPROM transistors encapsulated in hermetic packages with glass windows to enable UV erasure. There are also commercially available EPROM transistors encapsulated in a hard black plastic called OTP (One Time Programmable) devices which are not erasable with UV irradiation.

A UPROM (Unerasable Programmable Read Only Memory) cell differs from an EPROM in that it is not erasable by UV irradiation because it is covered by a metallization layer. Typical metals employed for the metallization layer include aluminum, silicon, e.g., polysilicon, copper and alloys thereof, preferably aluminum. See, for example, U.S. Pat. No. 5,063,424. In a typical semiconductor device comprising EPROM circuitry, UPROM transistors are located outside of the core array and connected to circuits which control the redundancy circuits and to a voltage supply.

A typical UPROM transistor is shown schematically in FIG. 1, wherein field oxide 2 is formed on semiconductor substrate 1 with an implanted insulation zone therebetween. Floating gate 7 is formed on substrate 1 with gate oxide 6 therebetween. Dielectric layer 8 is formed on floating gate 7 and polysilicon planarization barrier 9 formed on dielectric layer 8. Control gate line 13 is formed on polysilicon planarization barrier 9.

The current consumed by a semiconductor device is called the Icc current. There are several user modes for EPROM and UPROM transistors, including an active or dynamic mode and two sleep modes. A first sleep mode is called Icc standby (Iccsb) which is a standard TTL (Transistor Transistor Logic) conventional mode. The other sleep mode is Icc super-standby (Iccssb) which is a CMOS (Complimentary Metal on Silicon) conventional mode. The CMOS Iccssb mode is normally specified at a significantly lower current than the TTL Iccsb mode. For example, the TTL Iccsb mode may be specified at 0.001 amperes, while the CMOS Iccssb mode may be specified at 0.0001 amperes. In order to achieve such a low CMOS Iccssb mode, the threshold voltage of the EPROM and UPROM transistors is normally targeted at about 1–1.5 amperes, preferably 1–1.2 amperes, most preferably 1 ampere.

The CMOS Iccssb mode represents a major problem in the semiconductor industry. In most CMOS technologies, the Iccssb test failures represent a major source of rejects for data sheet parameters and, consequentially, considerable economic waste. The attainment of a CMOS Iccssb mode of 100 microamperes requires a basically defect free manufacturing process.

The problem of CMOS Iccssb test failures is exacerbated by the existence of numerous possible sources of such failures. The most common sources of such failures are suspected to be defects generated during the various manufacturing processes of the semiconductor circuitry. Semiconductor processing comprises hundreds of steps. In order to isolate the particular step or combination of steps which create MOS Iccssb test failures, a complex failure analysis must be performed by highly skilled individuals. The success of a failure analysis project is highly dependent upon the skills and resourcefulness of the individuals conducting the failure analysis.

Semiconductor devices comprising EPROM and UPROM transistors are subject to an increasingly high CMOS Iccssb failure rate. Failure rates of about 75–88% are not uncommon. It was originally thought that the majority of such failures stemmed from a leakage current due to the short channel lengths of the transistors. However, upon extensive investigation and experimentation, we discovered that the source of most CMOS Iccssb mode failures stemmed from the UPROM redundancy circuit. Upon micro-probe analysis, it was further discovered that UPROM transistors were turning on during the CMOS Iccssb mode, thereby generating failures. We attributed this problem to a negative threshold voltage which, in effect, turned the UPROM transistor into a depletion transistor. Upon further investigation, it was confirmed that the failed devices contained UPROM transistors having negative threshold voltages, with negative threshold voltages of about $-0.3$ and $-0.4$ volts not uncommon. Thus, during the MOS Iccssb mode conducted at 0 voltage, a UPROM transistor having a negative threshold voltage would turn on, thereby resulting in an inspection failure.

Upon extensive investigation, we discovered that the source of the negative threshold voltage problem is charge trapping during fabrication, i.e., injection of electrons into the floating gate of the UPROM transistor during charging. Several experimental attempts to correct the threshold voltage of the UPROM transistors met with failure and the yield continued to run between 12% and 25%. The experimental attempts failed primarily because UPROM transistors, unlike EPROM transistors, cannot be erased with ultraviolet radiation.

DISCLOSURE OF THE INVENTION

An object of the present invention is to erase a fabricated UPROM transistor.

Another object of the invention is to adjust the threshold voltage of a fabricated UPROM transistor to reduce CMOS Iccssb failures.

Still another object of the present invention is to fabricate a UPROM transistor which does not exhibit CMOS Iccssb leakage.

Another object of the present invention is to salvage semiconductor devices containing UPROM transistors that failed the CMOS Iccssb mode test.

Additional objects, advantages and other features of the invention will be set forth in part in the description which follows and in part will become apparent to those having ordinary skill in the art upon examination of the following or may be learned from the practice of the invention. The objects and advantages of the invention may be realized and attained as particularly pointed out in the appended claims.

According to the present invention, the foregoing and other objects are achieved in part by exposing a semiconductor device comprising an UPROM transistor to X-rays to effect erasure of the UPROM transistor.

Another aspect of the invention is a method of erasing an UPROM transistor comprising exposing a semiconductor device comprising the UPROM transistor to X-rays to effect erasure of the UPROM transistor and subsequently exposing the semiconductor device to UV irradiation.

A further aspect of the invention is a method of increasing the threshold voltage of an UPROM transistor from a negative value comprising exposing a semiconductor device containing the UPROM transistor to X-rays and subsequently exposing the semiconductor device to UV irradiation.

Still another aspect of the invention comprises a method of salvaging a semiconductor device comprising a UPROM transistor which failed the CMOS Iccssb mode test by exposing the semiconductor device to X-rays and subsequently to UV irradiation.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
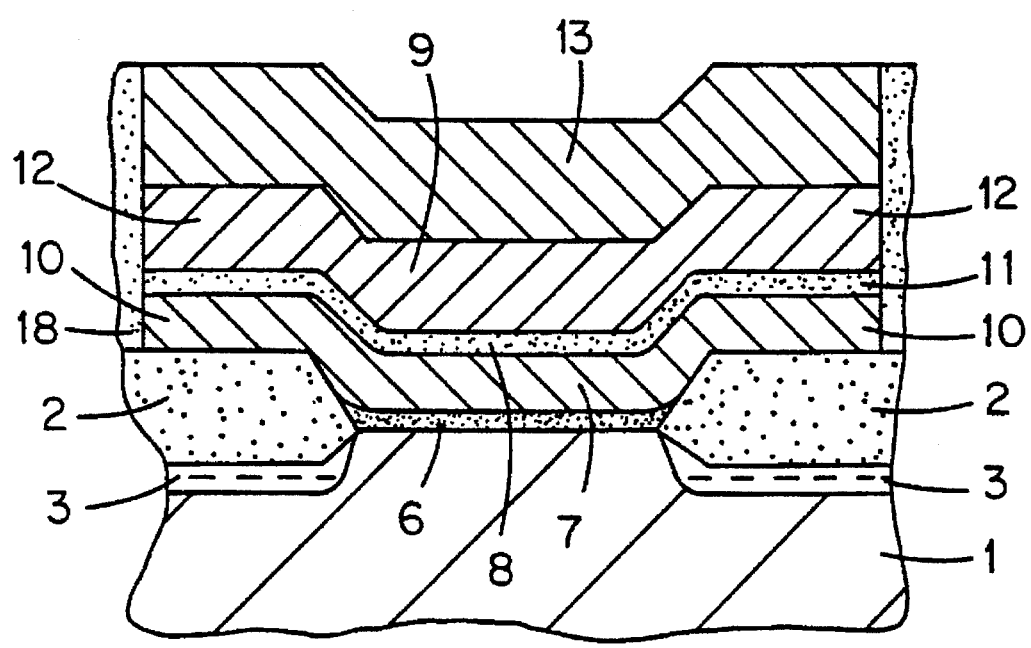
FIG. 1 schematically depicts a portion of a typical UPROM transistor.

The present invention is directed to a method of reducing the number of CMOS Iccssb failures of semiconductor devices comprising a UPROM transistor by exposing a semiconductor device containing a UPROM transistor to X-rays. Upon exposure of the semiconductor device to X-rays, the UPROM transistor is erased and the threshold voltage adjusted, as from a negative value to a target value consistent with a CMOS Iccssb test mode, such as about 1.0 to about 1.5 volts, preferably about 1.0 to about 1.2 volts, most preferably about 1.0 volt, thereby significantly reducing the rejection rate of semiconductor devices comprising a UPROM transistor due to CMOS Iccssb mode failures.

In a preferred embodiment, the semiconductor device is exposed to UV radiation subsequent to X-ray exposure, in order to erase any possible charging of other transistors, such as EPROM transistors, which may have occurred during X-ray exposure. The semiconductor devices to which the claimed method is applicable include any of those which contain a UPROM transistor, such as conventional wafers comprising a plurality of EPROM circuits and individually packaged EPROM circuits.

Our investigation has led to the conclusion that the high CMOS Iccssb rejection rate encountered in semiconductor devices comprising a UPROM transistor is due to the projection of holes into the floating gate of the UPROM transistor by electric fields generated during manufacturing steps wherein the equipment requires high electricomagnetic fields for operation. It has been found that such undesirable electrical fields are generated by equipment primarily associated with the deposition of the metal interconnection pattern and etching.

The injection of holes (positive charges) into the floating gate normally depresses the UPROM transistor's threshold voltage below the preferred target value, such as 1.0 volt. Upon accumulation of a sufficient amount of injected holes in the floating gate, the threshold voltage is depressed to a sufficient negative value to deplete the UPROM transistor. The present invention solves that problem by exposing a semiconductor device comprising the depleted UPROM transistor to X-rays, whereby the holes in the floating gate are ejected onto the substrate. Due to their high energy and short wavelength, X-rays are capable of penetrating the metallization layer of the UPROM transistor. Thus, a rejected semiconductor device comprising a UPROM transistor can be salvaged by adjusting the threshold voltage to a desired target value by X-ray exposure.

X-ray exposure of the semiconductor device may induce charging of other transistors on the semiconductor device, particularly EPROM transistors. According to a preferred embodiment of the invention, subsequent to X-ray exposure, the semiconductor device is exposed to UV irradiation to erase any charges gained by other transistors during X-ray exposure. This unique erasure technique comprising exposing a semiconductor device comprising a UPROM transistor to X-rays followed by UV irradiation increases the yield to about 78% vis-à-vis a yield of 12–25% without X-ray exposure. After treatment with X-rays, followed by UV irradiation, the semiconductor devices normally pass most standard tests.

The UPROM transistors which can be erased in accordance with the present invention include conventional UPROM transistors which normally comprise a metallization layer, such as a material selected from a group consisting of aluminum, silicon, e.g., polysilicon, copper and alloys thereof, preferably aluminum. Although any suitable source of X-rays may be employed, it is preferred to conduct exposure with X-rays generated from a tungsten target source. The intensity and duration of exposure can be easily optimized depending upon various factors. For example, it has been found that an intensity of about 10 rads/second at about 100 to about 130 kv, for a duration of about 1 to about 2 hours is usually sufficient to effect erasure of most UPROM transistors. Preferably, a semiconductor device comprising an UPROM transistor is exposed to X-rays having an intensity of about 10 rads/second at about 130 kv for about 2 hours.

According to the present invention, a semiconductor device comprising an UPROM transistor which has failed the conventional CMOS Iccssb mode test can be salvaged by exposing the semiconductor device to X-rays and, subsequently, to UV irradiation. Thus, the production yield of semiconductor device comprising a UPROM transistor can be significantly increased, thereby resulting in a significant reduction in production costs.

EXAMPLE I

Figure 2:
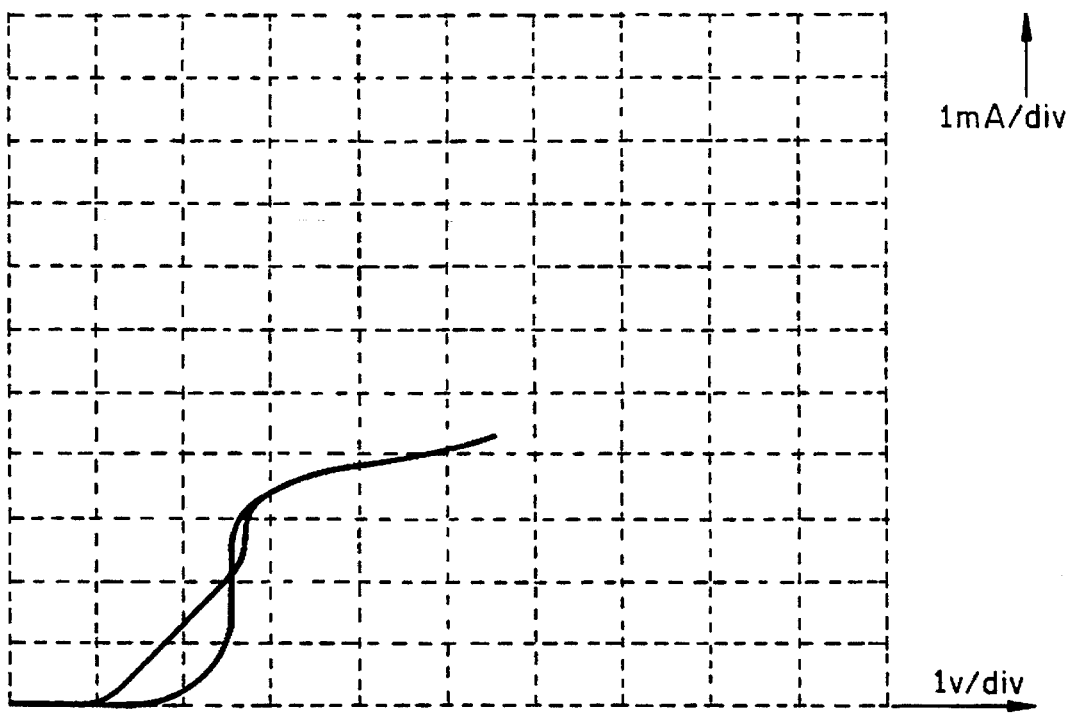
FIG. 2 is an I-V plot of a rejected semiconductor package.
Figure 3:
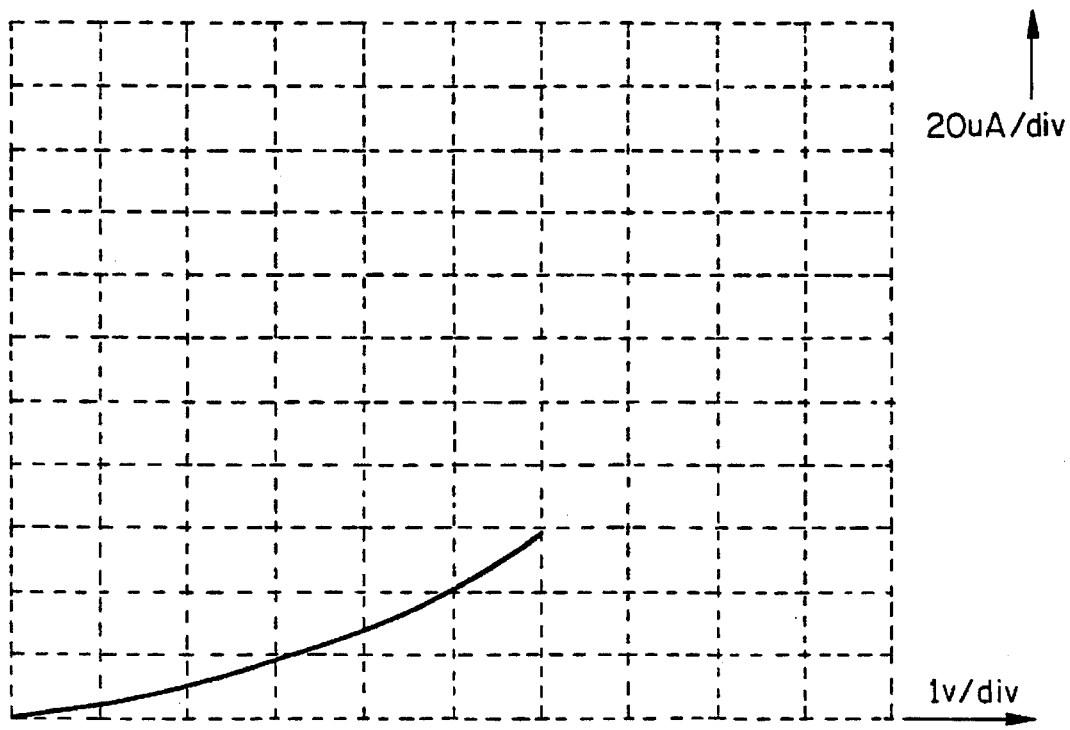
FIG. 3 is an I-V plot of the rejected semiconductor package after X-ray exposure.

The I (current)-V (voltage) I–V curve of a rejected semiconductor package comprising EPROM circuitry and a UPROM transistor that failed the CMOS Iccssb mode test is plotted in FIG. 2. The rejected semiconductor package was exposed to X-rays at an intensity of about 10 rads/second at about 130 kv intensity for about one hour. After exposure, I–V measurements of the treated rejected semiconductor package were again taken and the curve plotted as shown in FIG. 3. Based upon a comparison of FIG. 2 vis-à-vis FIG. 3, it is apparent that the Iccssb dramatically improved with no hysterisis. The erased semiconductor package was then successfully programmed and passed all required testing. Thus, a failed semiconductor package comprising a UPROM transistor was successfully erased and salvaged for use.

EXAMPLE II

Semiconductor wafers with EPROM dies (semiconductor devices) having UPROM circuits were subjected to the CMOS Iccssb mode test before and after by exposure to X-rays at an intensity of about 10 rads/second at about 130 kv for about 2 hours, followed by exposure to UV radiation for about 1 hour. The results are reported in Table I below.

TABLE I

| Sequence | Dies/Wafer Pass 60 uA Iccssb at 5.65 v | Dies/Wafer Pass 90 uA Iccssb at 5.65 v | Dies/Wafer Pass Iccssb at 3 v | Dies/Wafer Failed 3 v Iccssb | COMMENTS |
|---|---|---|---|---|---|
| 1) 2 hr. x-ray | 18 | 21 | 71 | 102 | 71 units can pass 3 v |
| 2) 1 hr. uv-erase | 109 | 0 | 1 | 12 | +91 passed 60 uA at 5.65 V |

| | Yield | Iccssb loss | Programming Loss | COMMENTS |
|---|---|---|---|---|
| 3) Sort 1 | 97 | 1 | 10 | Yield is dies per wafer |
| Before X-ray Sort 1 | 53 | 27 | 12 | |

Based upon the reported results, it is apparent that a substantial portion of the failures of semiconductor devices containing a UPROM transistor can be recovered by exposing the semiconductor devices to X-rays and subsequently to UV irradiation. This solution confirms the discovery that the source of failures is attributed to trapped charges (holes) in the floating gate.

The inventive method of treating semiconductor devices comprising a UPROM transistor by exposing the semiconductor devices to X-rays and, subsequently, to UV irradiation, enjoys utility in the manufacture of various types of semiconductor devices by various processing techniques. For example, the inventive method is applicable to the production, treatment and salvaging wafers containing a plurality of EPROM circuits or individually packaged semiconductor devices comprising an EPROM circuit. As a result of practicing the inventive method, the rejection rate of semiconductor devices containing a UPROM transistor is dramatically lowered with an attendant reduction in manufacturing costs.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

We claim:

1. A method of erasing an UPROM transistor, which method comprises erasing by exposing the UPROM transistor to X-rays, thereby increasing the threshold voltage of the UPROM transistor from a negative value.

2. The method according to claim 1, further comprising exposing a semiconductor device containing the UPROM transistor to UV radiation subsequent to X-ray exposure.

3. The method according to claim 2, wherein the UPROM transistor contains a metallization layer comprising a material selected from the group consisting of aluminum, silicon, copper and alloys thereof.

4. The method according to claim 3, wherein the material is aluminum.

5. The method according to claim 2, wherein the X-rays are generated from a tungsten target source.

6. The method according to claim 2, wherein the X-ray exposure is conducted at an intensity of about 10 rads/second at about 100–about 130 kv, for about 1 to about 2 hours.

7. The method according to claim 6, wherein the X-ray exposure is conducted at an intensity of about 10 rads/second at about 130 kv for about 2 hours.

8. A method of erasing a UPROM transistor in a semiconductor device, which method comprises:

erasing by exposing the semiconductor device to X-rays; and subsequently exposing the semiconductor device to UV irradiation, wherein the threshold voltage of the UPROM transistor is increased from a negative value by the X-ray exposure.

9. The method according claim 8, wherein the threshold voltage of the UPROM transistor is increased from a negative value to about 1.0 volt.

10. The method according to claim 2, wherein the semiconductor device comprises a wafer with a plurality of EPROM circuits.

11. The method according to claim 2, wherein the semiconductor device comprises a packaged EPROM circuit.

12. A method of salvaging a fabricated semiconductor device comprising a UPROM transistor, which semiconductor device was found unsuitable for use due to trapped charges, which method comprises erasing the UPROM transistor by exposing the semiconductor device to X-rays.

13. The method according to claim 12, which further comprises exposing the semiconductor device to UV exposure subsequent to X-ray exposure.

14. The method according to claim 13, wherein the semiconductor device comprises a wafer with a plurality of EPROM circuits.

15. The method according to claim 13, wherein the semiconductor device comprises a packaged EPROM circuit.

16. The method according to claim 13, wherein the UPROM transistor contains a metallization layer comprising a material selected from the group consisting of aluminum, silicon, copper and alloys thereof.

17. The method according to claim 16, wherein the material is aluminum.

18. The method according to claim 13, wherein X-ray exposure is conducted at an intensity of about 10 rads/second at about 100–about 130 kv, for about 1 to about 2 hours.

19. The method according to claim 14, wherein X-ray exposure is conducted at an intensity of about 10 rads/second at about 130 kv for about 2 hours.

20. The method according to claim 13, wherein the threshold voltage of the UPROM transistor is increased form a negative value by the X-ray exposure.

21. The method according to claim 20, wherein the threshold voltage of the UPROM transistor is increased form a negative value to about 1.0 volt.

22. The method according to claim 13, wherein the semiconductor device failed the MOS super standby test mode prior to X-ray exposure and passed the same test subsequent to UV exposure.

23. The method according to claim 13, wherein the X-rays are generated from a tungsten target source.

24. A method of making a semiconductor device containing an UPROM transistor, comprising erasing the UPROM transistor by exposing the semiconductor device to X-rays.

25. The method according to claim 24, further comprising exposing the semiconductor device to UV radiation subsequent to X-ray exposure.

26. The method according to claim 25, wherein the UPROM transistor contains a metallization layer comprising a material selected from the group consisting of aluminum, silicon, copper and alloys thereof.

27. The method according to claim 26, wherein the material is aluminum.

28. The method according to claim 25, wherein the X-rays are generated from a tungsten target source.

29. The method according to claim 25, wherein the X-ray exposure is conducted at an intensity of about 10 rads/second at about 100–about 130 kv, for about 1 to about 2 hours.

30. The method according to claim 29, wherein the X-ray exposure is conducted at an intensity of about 10 rads/second at 130 kv for about 2 hours.

31. The method according to claim 25, wherein the semiconductor device comprises a wafer with a plurality of EPROM circuits.

32. The method according to claim 25, wherein the semiconductor device comprises a packaged EPROM circuit.

* * * * *